(12) United States Patent
Shao et al.

(10) Patent No.: US 11,854,862 B2
(45) Date of Patent: Dec. 26, 2023

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN); Youming Liu, Hefei (CN); Yi Jiang, Hefei (CN); Xingsong Su, Hefei (CN); Yuhan Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/809,092

(22) Filed: Jun. 27, 2022

(65) Prior Publication Data
US 2023/0335430 A1    Oct. 19, 2023

Related U.S. Application Data

(63) Continuation of application No. PCT/CN2022/092947, filed on May 16, 2022.

(30) Foreign Application Priority Data

Apr. 18, 2022    (CN) .......................... 202210404911.5

(51) Int. Cl.
*H01L 21/76*    (2006.01)
*H01L 21/762*   (2006.01)
(Continued)

(52) U.S. Cl.
CPC ...... *H01L 21/76205* (2013.01); *H01L 21/041* (2013.01); *H01L 21/042* (2013.01); *H01L 21/311* (2013.01)

(58) Field of Classification Search
CPC ............. H01L 21/76205; H01L 21/041; H01L 21/042; H01L 21/311
See application file for complete search history.

(56) References Cited

U.S. PATENT DOCUMENTS 7,858,477 B2    12/2010    Kim
8,354,345 B2    1/2013     Lee
(Continued)

FOREIGN PATENT DOCUMENTS

CN    102082117 A    6/2011
CN    102760669 A    10/2012
(Continued)

OTHER PUBLICATIONS

International Search Report cited in PCT/CN2022/092947 dated Nov. 25, 2022, 16 pages.
(Continued)

*Primary Examiner* — Mohammed Shamsuzzaman
(74) *Attorney, Agent, or Firm* — Cooper Legal Group, LLC

(57) ABSTRACT

The present disclosure relates to a semiconductor structure and a manufacturing method thereof. The method of manufacturing a semiconductor structure includes: providing a base; forming a plurality of first trenches arranged in parallel at intervals and extending along a first direction, and an initial active region between two adjacent ones of the first trenches, wherein the initial active region includes a first initial source-drain region close to a bottom of the first trench, a second initial source-drain region away from the bottom of the first trench, and an initial channel region located between the first initial source-drain region and the second initial source-drain region; forming a protective dielectric layer, wherein the protective dielectric layer covers a sidewall of the second initial source-drain region and
(Continued)

a sidewall of the initial channel region; thinning the first initial source-drain region.

7 Claims, 6 Drawing Sheets

(51) Int. Cl.
*H01L 21/311* (2006.01)
*H01L 21/04* (2006.01)

(56) References Cited

U.S. PATENT DOCUMENTS

| | | | |
|---|---|---|---|
| 8,759,907 B2 | 6/2014 | Wu et al. | |
| 10,079,267 B1* | 9/2018 | Yeh | H10N 70/011 |
| 10,763,262 B2 | 9/2020 | Shih | |
| 11,195,923 B2 | 12/2021 | Thareja et al. | |
| 11,521,975 B2 | 12/2022 | Yen | |
| 2009/0230466 A1* | 9/2009 | Kim | H10B 12/053 |
| | | | 257/E29.264 |
| 2011/0130004 A1* | 6/2011 | Lee | H01L 29/7827 |
| | | | 257/E21.241 |
| 2011/0284939 A1 | 11/2011 | Chung et al. | |
| 2014/0103414 A1* | 4/2014 | Koldiaev | H01L 27/1211 |
| | | | 257/296 |
| 2017/0323969 A1 | 11/2017 | Masuoka et al. | |
| 2018/0301456 A1 | 10/2018 | Cho et al. | |
| 2019/0244971 A1* | 8/2019 | Harari | G11C 16/24 |
| 2021/0408118 A1* | 12/2021 | Zhu | H10B 61/22 |
| 2022/0093612 A1* | 3/2022 | Liaw | H01L 29/775 |
| 2023/0010065 A1* | 1/2023 | Chiu | H01L 29/42376 |
| 2023/0024307 A1* | 1/2023 | Lee | H10B 53/30 |

FOREIGN PATENT DOCUMENTS

| | | | | |
|---|---|---|---|---|
| CN | 109285838 A | * | 1/2019 | ............ G11C 16/08 |
| CN | 113241347 A | | 8/2021 | |
| CN | 113611671 A | | 11/2021 | |
| CN | 114141714 A | | 3/2022 | |
| CN | 114156236 A | | 3/2022 | |
| CN | 115116932 A | * | 9/2022 | ....... H01L 27/10814 |
| KR | 20110060864 A | * | 6/2010 | ........... H01B 12/053 |
| TW | 202020945 A | | 6/2020 | |
| TW | 202029504 A | | 8/2020 | |
| TW | 202145535 A | | 12/2021 | |

OTHER PUBLICATIONS

TW Office Action cited in TW111131393, dated Aug. 17, 2023, 12 pages.

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/092947, filed on May 16, 2022, which claims the priority to Chinese Patent Application 202210404911.5, titled "SEMICONDUCTOR STRUCTURE AND MANUFACTURING METHOD THEREOF" and filed with the China National Intellectual Property Administration (CNIPA) on Apr. 18, 2022. The entire contents of International Application No. PCT/CN2022/092947 and Chinese Patent Application 202210404911.5 are incorporated herein by reference.

TECHNICAL FIELD

The present disclosure relates to the field of semiconductor manufacturing technologies, and in particular to a semiconductor structure and a manufacturing method thereof.

BACKGROUND

In a conventional gate-all-around (GAA) transistor, a metal silicide layer is usually used as a bit line structure. In the traditional process, a metal material is deposited at the bottom of each word-line trench, and then is annealed into a metal silicide layer. The metal silicide layer diffuses to a range in the base, and the metal silicide layers at the bottom of the word-line trenches are connected to form a bit line structure.

However, in the foregoing method, it is difficult to accurately control the diffusion range of the metal silicide layer, and therefore the diffusion range of the metal silicide layer may be too small to cause connection. In addition, the surface of the finally prepared bit line structure is uneven, resulting in a high resistance in bit lines.

SUMMARY

Embodiments of the present disclosure provide a semiconductor structure and a manufacturing method thereof.

According to some embodiments, a first aspect of the present disclosure provides a method of manufacturing a semiconductor structure, including: providing a base; forming a plurality of first trenches arranged in parallel at intervals and extending along a first direction, and an initial active region between two adjacent ones of the first trenches, wherein the initial active region includes a first initial source-drain region close to a bottom of the first trench, a second initial source-drain region away from the bottom of the first trench, and an initial channel region located between the first initial source-drain region and the second initial source-drain region; forming a protective dielectric layer, wherein the protective dielectric layer covers a sidewall of the second initial source-drain region and a sidewall of the initial channel region; thinning the first initial source-drain region; and depositing a conductive material layer at two opposite sides of the first initial source-drain region, to form bit line structures, wherein the bit line structure extends along the first direction.

According to some embodiments, a second aspect of the present disclosure provides a semiconductor structure, including: a base, wherein the base includes a pillar active region, and the pillar active region includes a first source-drain region, a second source-drain region away from the first source-drain region, and a channel region located between the first source-drain region and the second source-drain region; and a width of the first source-drain region is smaller than a width of the channel region, and the first source-drain region includes a metal silicide layer; a plurality of bit line structures extending along a first direction, located outside the first source-drain region, and electrically connected to the first source-drain region; and a plurality of word line structures extending along a second direction and located outside the channel region.

Details of one or more embodiments of the present disclosure are illustrated in the following drawings and description. Other features, objectives, and advantages of the present disclosure become evident in the specification, claims, and accompanying drawings.

BRIEF DESCRIPTION OF THE DRAWINGS

To describe the technical solutions in the embodiments of the present disclosure more clearly, the accompanying drawings required to describe the embodiments are briefly described below. Apparently, the accompanying drawings described below are only some embodiments of the present disclosure. Those of ordinary skill in the art may further obtain accompanying drawings of other embodiments based on these accompanying drawings without creative efforts.

DETAILED DESCRIPTION

Figure 1:
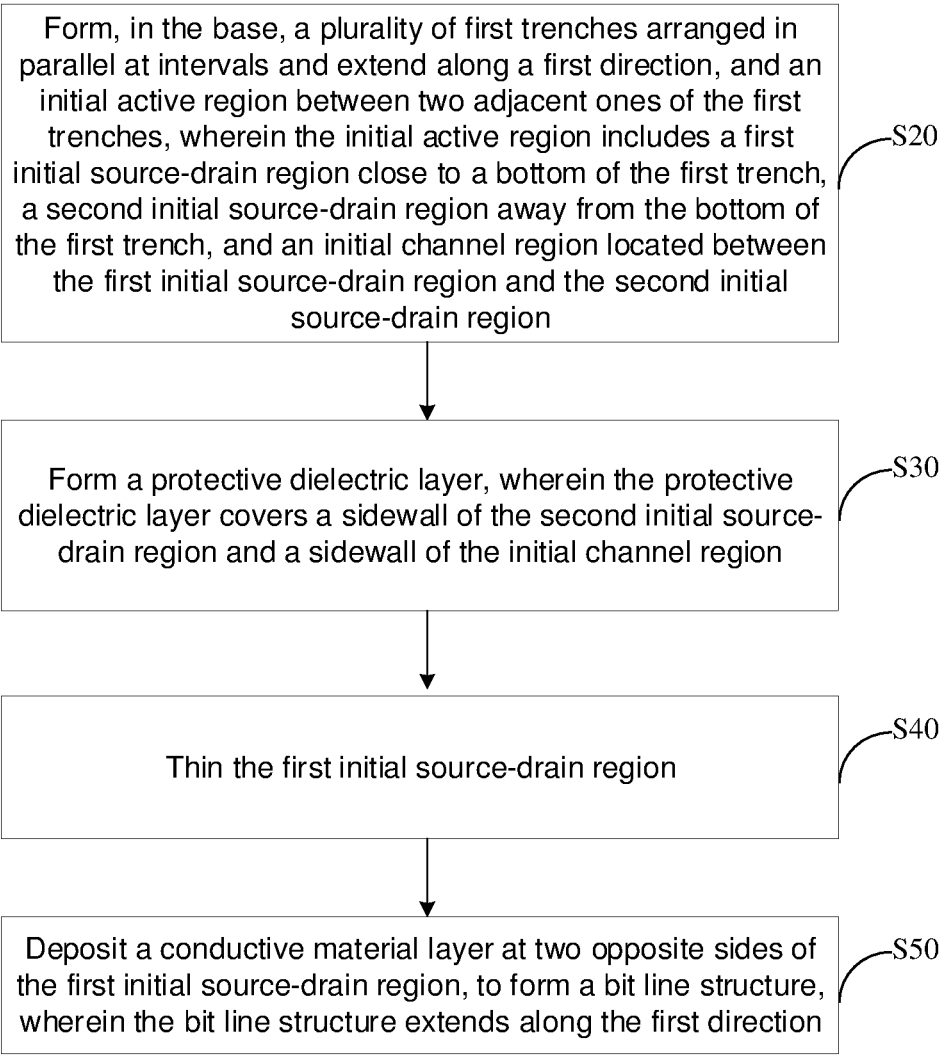
FIG. 1 is a flow block diagram of a method of manufacturing a semiconductor structure according to an embodiment of the present application.

To facilitate the understanding of the present disclosure, the present disclosure is described more completely below with reference to the related accompanying drawings. Preferable embodiments of the present disclosure are shown in the drawings. However, the present disclosure may be embodied in various forms without being limited to the embodiments described herein. On the contrary, these embodiments are provided to make the present disclosure more thorough and comprehensive.

Unless otherwise defined, all technical and scientific terms used in the specification have the same meaning as commonly understood by those skilled in the technical field of the present disclosure. The terms used in the specification of the present disclosure are merely intended to describe specific embodiments, rather than to limit the present disclosure. The term "and/or" used herein includes any and all combinations of one or more of the associated listed items.

In the description of a position relationship, unless otherwise specified, when one element, such as, a layer or substrate, is referred to as being "on" another film layer, it can be directly located on the another film layer or there may be an intermediate film layer. Further, when a layer is referred to as being "under" another layer, it can be directly under the another layer, or there may be one or more intermediate layers. It can also be understood that, when a layer is referred to as being "between" two layers, it may be the only layer between the two layers, or there may be one or more intermediate layers.

In a case that terms "include", "have", and "contain" in the specification are used, unless clear qualifiers such as "only" and "consist of" are used, another component can be added. Unless the contrary is mentioned, terms in the singular form may include the plural form but are not to be understood as a single one.

In the present disclosure, unless otherwise clearly specified, the term "interconnection" or "connection" should be understood in a broad sense. For example, the connection may be a fixed connection, a detachable connection, or an integrated connection; a direct connection or an indirect connection via an intermediate medium; or an intercommunication between two components. Those of ordinary skill in the art should understand the specific meanings of the above terms in the present disclosure based on specific situations.

In addition, in the description of the present disclosure, the terms "multiple", "each another", "overlap", "stacked" and "a plurality of" refer to two or more, unless otherwise specified.

In the traditional manufacturing process of the GAA transistor, the bit line structure is usually prepared by forming a metal silicide layer at a bottom of each word-line trench. Specifically, a metal material is deposited at the bottom of each word-line trench, and then is annealed into a metal silicide layer. The metal silicide layer may diffuse to a range in the base, and the metal silicide layers at the bottom of the adjacent word-line trenches are connected to form a bit line structure.

However, in the foregoing method, it is difficult to accurately control the diffusion range of the metal silicide layer, and therefore a problem may occur that the diffusion range of the metal silicide layer is too small to cause connection. In addition, the surface of the finally prepared bit line structure is uneven, resulting in a high bit line resistance. To resolve the foregoing technical problem, as shown in FIG. 1, an embodiment of the present application discloses a method of manufacturing a semiconductor structure, including the following steps:

S10: Provide a base;

S20: Form, in the base, a plurality of first trenches arranged in parallel at intervals and extending along a first direction, and an initial active region between two adjacent ones of the first trenches, wherein the initial active region includes a first initial source-drain region close to a bottom of the first trench, a second initial source-drain region away from the bottom of the first trench, and an initial channel region located between the first initial source-drain region and the second initial source-drain region;

S30: Form a protective dielectric layer, wherein the protective dielectric layer covers a sidewall of the second initial source-drain region and a sidewall of the initial channel region;

S40: Thin the first initial source-drain region; and

S50: Deposit a conductive material layer at two opposite sides of the first initial source-drain region, to form bit line structures, wherein the bit line structure extends along the first direction.

In the foregoing method of manufacturing a semiconductor structure, thinning the first initial source-drain region, and depositing the conductive material layer at two opposite sides of the first initial source-drain region can manufacture a bit line structure with a flat surface, improve the quality of the bit line, and reduce the bit line resistance. In addition, the bit line structure has a larger contact area with the first initial source-drain region, which reduces the contact resistance and can decrease the RC delay.

Figure 2:
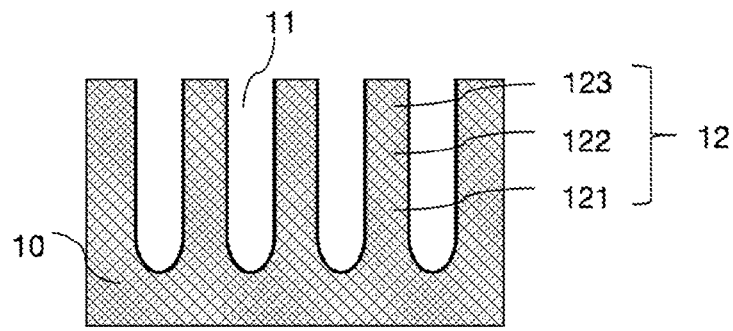
FIG. 2 is a schematic diagram of a cross-sectional structure of a semiconductor structure after a first trench and an initial active region are formed in a base according to an embodiment of the present application.

For example, the base 10 provided in step S10 may include, but is not limited to a silicon base. In step S20, as shown in FIG. 2, a plurality of first trenches 11 arranged in parallel at intervals and extending along a first direction, and an initial active region 12 between two adjacent ones of the first trenches 11 are formed in the base 10.

For example, the first trench 11 may be formed through a self-aligned double patterning (SADP) process or a self-aligned quadruple patterning process. The initial active region 12 includes a first initial source-drain region 121 close to a bottom of the first trench 11, a second initial source-drain region 123 away from the bottom of the first trench 11, and an initial channel region 122 located between the first initial source-drain region 121 and the second initial source-drain region 123. For example, the pillar active region 12 is an N-type doped region, and the base 10 is a P-type doped base.

In step S30, the protective dielectric layer 14 is formed, to cover a sidewall of the second initial source-drain region and a sidewall of the initial channel region 122.

Figure 4:
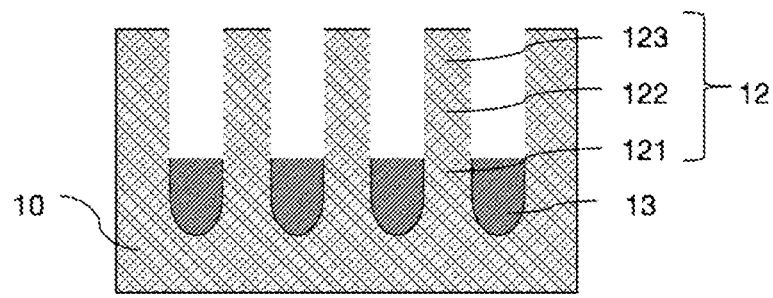
FIG. 4 is a schematic diagram of a cross-sectional structure of the semiconductor structure after a height of the filling dielectric layer is decreased according to an embodiment of the present application.

For example, as shown in FIG. 4, before the protective dielectric layer 14 is formed, a filling dielectric layer 13 may be formed first in the first trench 11. The filling dielectric layer 13 covers a sidewall of the first initial source-drain region 121, and exposes the sidewall of the second initial source-drain region 123 and the sidewall of the initial channel region 122. The filling dielectric layer 13 may be, for example, a silicon oxide layer, a silicon oxynitride layer, or another dielectric layer.

Figure 3:
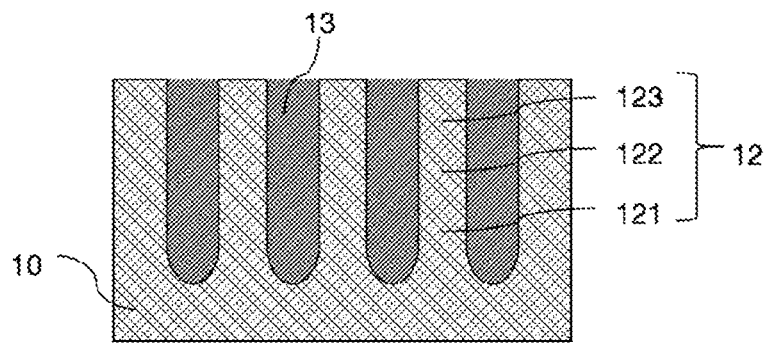
FIG. 3 is a schematic diagram of a cross-sectional structure of the semiconductor structure after a filling dielectric layer fills up the first trench according to an embodiment of the present application.

For example, the silicon oxide layer may be formed in the first trench 11 through a chemical vapor deposition process, an atomic layer deposition process, a plasma vapor deposition process, an in-situ steam generation (ISSG) process, or a rapid thermal oxidation (RTO) process. The silicon oxide layer fills up the first trench 11 and covers the upper surface of the base 10. As shown in FIG. 3, the silicon oxide layer may be polished through a chemical mechanical polishing (CMP) process, such that the upper surface of the silicon oxide layer is flush with that of the substrate. Then, as shown in FIG. 4, the silicon oxide layer is etched back through an etching process to decrease the height of the silicon oxide layer in the first trench 11, until the sidewall of the second initial source-drain region 123 and the sidewall of the initial channel region 122 are exposed, to obtain the filling dielectric layer 13.

Figure 5:
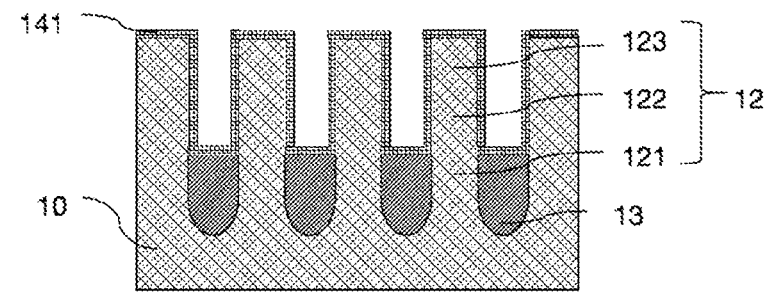
FIG. 5 is a schematic diagram of a cross-sectional structure of the semiconductor structure after a protective dielectric material layer is formed according to an embodiment of the present application.

After the filling dielectric layer 13 is formed, the forming the protective dielectric layer 14 on the obtained structure specifically includes the following steps:

S31: Deposit a protective dielectric material layer 141, wherein the protective dielectric material layer 141 covers an upper surface of the filling dielectric layer 13, the sidewall of the initial channel region 122, and the sidewall and a top surface of the second initial source-drain region 123, as shown in FIG. 5.

For example, the protective dielectric material layer 141 may include, but is not limited to a carbon layer. For example, a carbon layer may be formed on the upper surface of the filling dielectric layer 13, the sidewall of the initial channel region 122, and the sidewall and a top surface of the second initial source-drain region 123 through the chemical vapor deposition process or the atomic layer deposition process. The thickness of the carbon layer may be 1 nm to 6 nm such as 1 nm, 3 nm, 5 nm, or 6 nm.

Figure 6:
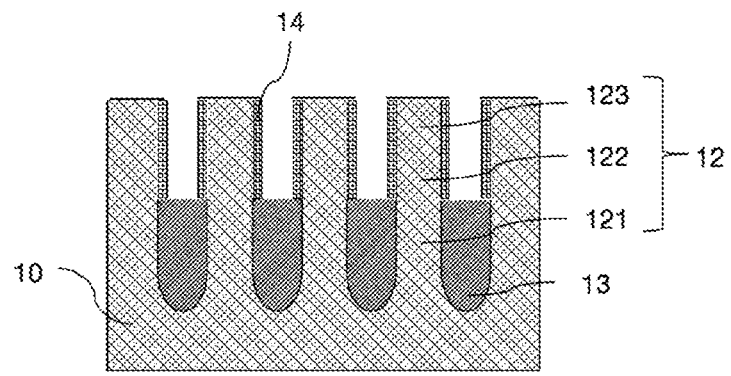
FIG. 6 is a schematic diagram of a cross-sectional structure of the semiconductor structure after a protective dielectric layer is formed according to an embodiment of the present application.

S32: Remove the protective dielectric material layer 141 on the upper surface of the filling dielectric layer 13 and on the top surface of the second initial source-drain region 123, to form the protective dielectric layer 14, as shown in FIG. 6.

For example, the carbon layer is etched back, to remove the protective dielectric material layer 141 on the upper surface of the filling dielectric layer 13 and on the top surface of the second initial source-drain region 123. The carbon layer on the sidewall of the active region is retained, to form the protective dielectric layer 14, which covers the sidewalls of the second initial source-drain region 123 and the initial channel region 122.

In some embodiments, the protective dielectric layer 14 may further be a nitride layer. For example, a nitride layer may be formed through deposition on the upper surface of the filling dielectric layer 13, the sidewall of the initial channel region 122, and the sidewall and a top surface of the second initial source-drain region 123. Then, the nitride layer on the upper surface of the filling dielectric layer 13 and on the top surface of the second initial source-drain region 123 is removed. For example, the nitride layer may be a reverse top selective (RTS) nitride layer. Specifically, the RTS nitride layer may be formed through a deposition process, and then is cleaned by using a DHF cleaning technology, to remove the nitride layer on the upper surface of the filling dielectric layer 13 and on the top surface of the second initial source-drain region 123. The nitride layer on the sidewall of the active region is retained as the protective dielectric layer 14, to cover the sidewalls of the second initial source-drain region 123 and the initial channel region 122. The DHF cleaning solution is a mixed solution of HF, $H_2O_2$, and $H_2O$.

Figure 7:
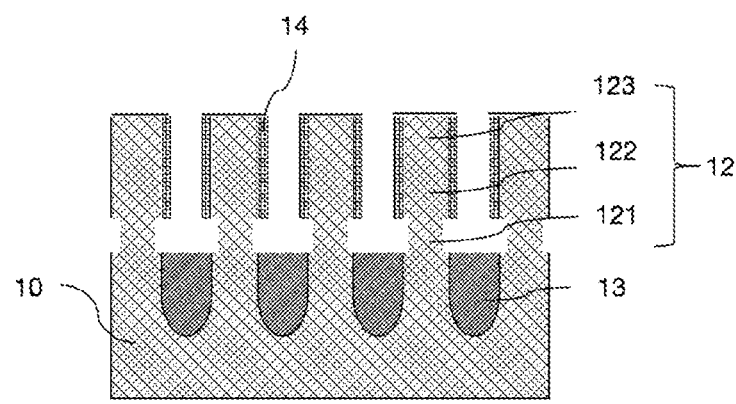
FIG. 7 is a schematic diagram of a cross-sectional structure of a semiconductor structure after a first initial source-drain region is thinned according to an embodiment of the present application.

In step S40, the first initial source-drain region 121 is thinned, to obtain the structure shown in FIG. 7. For example, the step of thinning the first initial source-drain region 121 includes:

S41: Partially remove the filling dielectric layer 13, to expose the sidewall of the first initial source-drain region 121.

For example, the filling dielectric layer 13 in the first trench 11 may be etched through a wet etching process or dry etching process, to decrease the height of the filling dielectric layer 13, and expose the sidewall of the first initial source-drain region 121.

S42: Oxidize the first initial source-drain region 121, to form a sidewall oxide layer on the sidewall of the first initial source-drain region 121.

For example, the exposed sidewall of the first initial source-drain region 121 is oxidized through an oxidation process, to form the sidewall oxide layer. Using a silicon base as an example, after the oxidation, the sidewall of the first initial source-drain region 121 forms a silicon dioxide layer of a specific thickness, that is, the sidewall oxide layer. For example, the thickness of the sidewall oxide layer may be ⅓ to ½ of that of the first initial source-drain region 121.

S43: Remove the sidewall oxide layer.

For example, the sidewall oxide layer may be removed through an etching process. The sidewall oxide layer is formed on the sidewall of the first initial source-drain region 121, and then is removed, to reduce the thickness of the first initial source-drain region 121 to ½ to ⅔ of the original one. Spaces at two sides of the first initial source-drain region 121 may be used for manufacturing metal bit lines.

Optionally, in some embodiments, after the first initial source-drain region 121 is thinned, and before the conductive material layer 16 is deposited, the method further includes:

S44: Deposit a metal material on exposed surfaces of the first initial source-drain region 121 and the second initial source-drain region 123.

For example, the metal material may include at least one of cobalt and nickel. Optionally, the metal material may also include titanium, zirconium, tantalum, tungsten, palladium, or platinum. The metal material covers the upper surface of the second initial source-drain region 123 and the sidewall of the first initial source-drain region 121.

Figure 8:
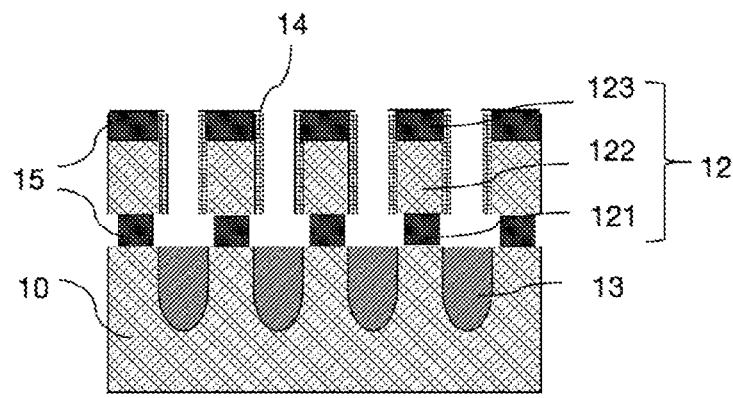
FIG. 8 is a schematic diagram of a cross-sectional structure of the semiconductor structure after a metal silicide layer is formed according to an embodiment of the present application.

S45: Perform an annealing process, to form a metal silicide layer 15 in the first initial source-drain region 121 and in the second initial source-drain region 123, as shown in FIG. 8.

For example, the annealing process may include the rapid thermal processing (RTP) process. Through the annealing process, the metal material chemically reacts with the silicon to form the metal silicide layer 15, such as a titanium silicide layer, a zirconium silicide layer, a tantalum silicide layer, a tungsten silicide layer, a palladium silicide layer, a platinum silicide layer, or a cobalt silicide layer. The conductive property of the metal silicide is between those of metal and silicon. The metal silicide layer 15 is formed in the first initial source-drain region 121 and the second initial source-drain region 123, to reduce the contact resistance and the RC delay.

After the metal silicide layer 15 is formed, the metal material remained in the first trench 11 and on the surface of the base 10 is removed.

Figure 9:
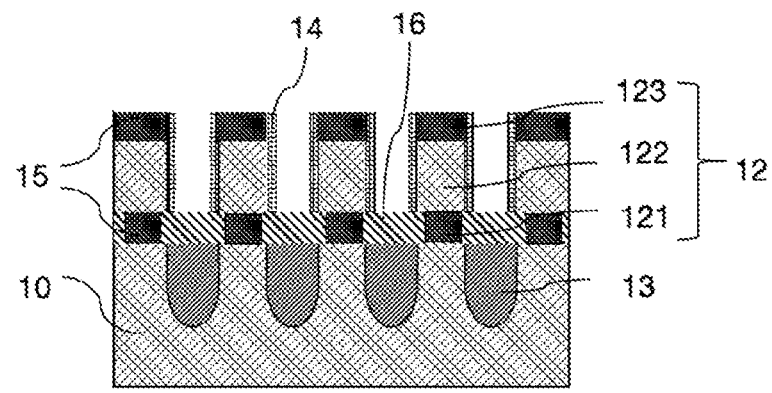
FIG. 9 is a schematic diagram of a cross-sectional structure of the semiconductor structure after a conductive material layer is formed according to an embodiment of the present application.

In step S50, the step of the process for forming the bit line structure includes:

S51: Deposit and etch back the conductive material layer 16 on the upper surface of the filling dielectric layer 13, to make a top surface of the conductive material layer 16 flush with a bottom surface of the protective dielectric layer 14, as shown in FIG. 9.

For example, the conductive material layer 16 may be a metal material layer with a low resistivity, such as germanium (Ge), tungsten (W), copper (Cu), or gold (Au). The conductive material layer 16 may be formed in the first trench 11 through a deposition process, and then is etched back, to make the top surface of the conductive material layer 16 flush with the bottom surface of the protective dielectric layer 14.

Figure 10:
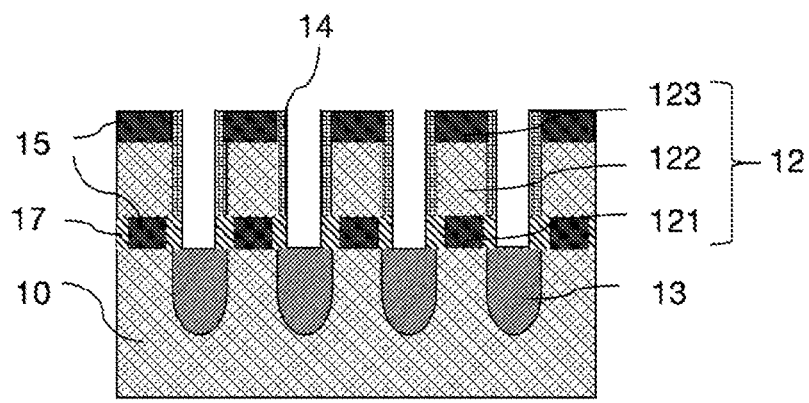
FIG. 10 is a schematic diagram of a cross-sectional structure of the semiconductor structure after a bit line structure is formed according to an embodiment of the present application.

S52: Etch the conductive material layer 16 based on the protective dielectric layer 14, to cut off the conductive material layer 16, and expose a partial upper surface of the filling dielectric layer 13, and form the discrete bit line structures 17, as shown in FIG. 10.

For example, the protective dielectric layer 14 may be used as a hard mask layer, to etch the conductive material layer 16, until a partial upper surface of the filling dielectric layer 13 is exposed, thereby cutting off the conductive material layer 16, to form the bit line structures 17 at two sides of each of the first initial source-drain region 121. The bit line structures 17 are independent of each other.

Figure 11:
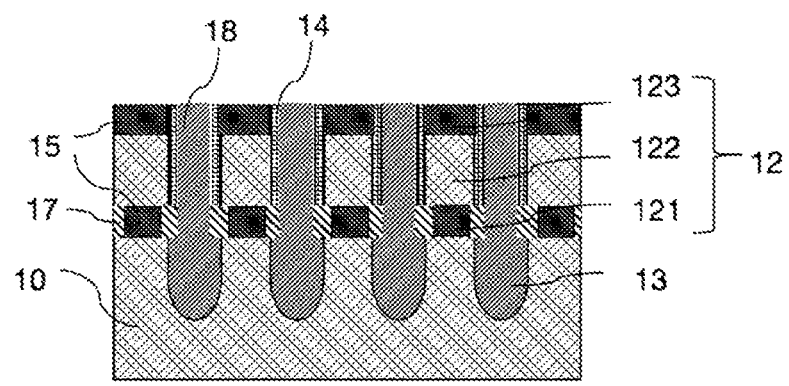
FIG. 11 is a schematic diagram of a cross-sectional structure of the semiconductor structure after an isolation dielectric layer is formed according to an embodiment of the present application.

In some embodiments, after the discrete bit line structures 17 are formed, the method further includes: forming an isolation dielectric layer 18, where the isolation dielectric layer 18 fills up the first trench 11, and a top surface of the isolation dielectric layer 18 is flush with that of the second initial source-drain region 123, as shown in FIG. 11.

For example, the isolation dielectric layer 18 and the filling dielectric layer 13 may be made of a same material, such as a silicon oxide layer or a silicon oxynitride layer. The isolation dielectric layer 18 is formed in the first trench 11, to separate the bit line structures 17 along the first direction. The isolation dielectric layer 18 further separates adjacent initial active regions 12.

In the foregoing method of manufacturing a semiconductor structure, thinning the first initial source-drain region 121, and forming the metal bit lines at two sides of the first initial source-drain region 121 can obtain a bit line structure 17 with a flat surface, greatly reducing the bit line resistance. In addition, the forming the metal silicide layer 15 in the first initial source-drain region 121 can reduce a contact resistance between the active region and the bit line structure 17, and decrease the RC delay.

In some embodiments, after the isolation dielectric layer 18 is formed, the method further includes:

S60: Etch the initial active region 12, to form second trenches arranged in parallel at intervals along a second direction, and a pillar active region separated by the first trench 11 and the second trench, wherein the pillar active region includes a first source-drain region close to a bottom of the second trench, a second source-drain region away from the bottom of the second trench, and a channel region located between the first source-drain region and the second source-drain region, and a bottom surface of the second trench is at least lower than that of the channel region;

S70: Form a gate oxide layer and a gate material layer sequentially in the second trench, to cover a side surface of the channel region; and S80: Etch the gate material layer, to form a word line structure, wherein the word line structure extends along the second direction, and the first direction is perpendicular to the second direction.

In step S60, for example, the second trenches arranged in parallel at intervals and extending along a second direction may be formed in the base 10 by using the SADP or SAQP process. The first trench 11 and the second trench separate the initial active region 12 into pillar active regions arranged in an array. The pillar active region includes the first source-drain region, the channel region, and the second source-drain region sequentially stacked from bottom to top. The first source-drain region is electrically connected to the bit line structure 17. The bottom of the second trench is flush with that of the channel region. Optionally, in some embodiments, the bottom of the second trench is lower than that of the channel region.

In step S70, for example, the gate oxide layer may cover the bottom and the sidewall of the second trench. The gate material layer is located on the surface of the gate oxide layer, and fills up the second trench. The gate oxide layer may include, but is not limited to a silicon oxide layer, and the gate material layer may be a metal layer or a polysilicon layer. The process for forming the gate oxide layer may include the chemical vapor deposition process, the atomic layer deposition process, the plasma vapor deposition process, the ISSG process, or the RTO process.

Optionally, in some embodiments, after formed, the gate material layer is etched back to decrease its height, to make the top surface of the gate material layer flush with that of the channel region.

In step S80, for example, the gate material layer is etched to cut off its middle part in the second trench, and form the word line structures independent of each other. The word line structure includes a first part and a second part, which are respectively located at two opposite sides of the pillar active region. The word line structure extends along the second direction, and the first direction is perpendicular to the second direction. Optionally, in another embodiment, the first direction and the second direction may form an acute angle.

Optionally, in some other embodiments, after the second trench is formed, the method further includes: removing the protective dielectric layer 14 on the sidewall of the pillar active region, and decreasing the height of the isolation dielectric layer 18, to make the upper surface of the isolation dielectric layer 18 flush with the bottom surface of the second trench, and completely expose the sidewall of the channel region. The gate oxide layer formed in step S70 at least surrounds and covers the sidewall of the channel region. Optionally, the gate oxide layer may further cover the top surface of the isolation dielectric layer 18 and the sidewall of the second initial source-drain region 123. The gate material layer covers the surface of the gate oxide layer, and fills up a gap between adjacent pillar active regions in the second trenches. In step S80, the middle part of the gate material layer in the second trench is cut off along the second direction, to form the word line structures independent of each other.

In the foregoing method of manufacturing a semiconductor structure, the first initial source-drain region 121 is thinned, to increase a contact area between the bit line structure 17 and the first source-drain region. In addition, the first source-drain region includes the metal silicide layer 15, to reduce the contact resistance between the bit line structure 17 and the first source-drain region and decrease the RC delay. Further, the word line structure may be formed around the channel region, to obtain the GAA transistor and enhance the gate control capability.

The present application further discloses a method of manufacturing a semiconductor structure, which can be used to manufacture a semiconductor structure with metal silicide bit lines. For the process steps of forming a first trench 11, refer to step S20 in the foregoing embodiment.

Figure 12:
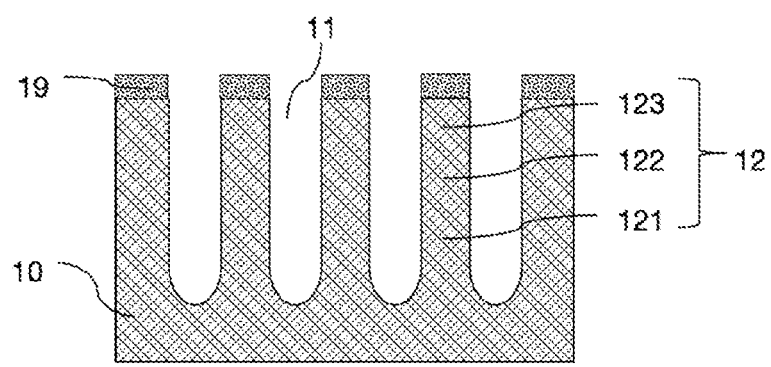
FIGS. 12 to 18 are schematic flowcharts of a process for manufacturing the bit line structure according to another embodiment of the present application.

In an embodiment, after the plurality of first trenches 11 arranged in parallel at intervals and extending along a first direction, and the initial active region 12 between two adjacent ones of the first trenches 11 are formed in the base 10, the method further includes: forming a cap layer 19 at a top of the initial active region 12, to protect the top of the initial active region 12 in a subsequent manufacturing process, as shown in FIG. 12. For example, the cap layer 19 may be a hard mask layer such as a silicon nitride layer.

The cap layer 19 is formed at the top of the initial active region 12. In the subsequent process of manufacturing the metal silicide bit line, the second initial source-drain region 123 and the metal material are separated, to prevent the metal silicide layer 15 from being formed in the second initial source-drain region 123.

In this embodiment, with reference to FIGS. 13 to 18, the step of forming the metal silicide bit line includes:

S30': Form a protective dielectric layer 14, wherein the protective dielectric layer 14 covers a sidewall of the second initial source-drain region, a sidewall of the initial channel region 122, and the sidewall of the cap layer 19; and S40': Form a metal silicide layer 15 in the first initial source-drain region 121, to obtain a bit line structure 17.

Figure 13:
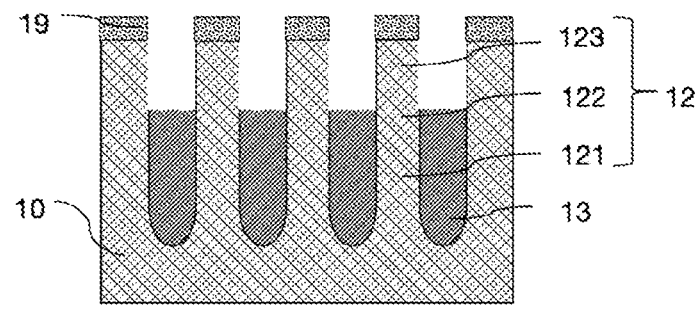
Figure 14:
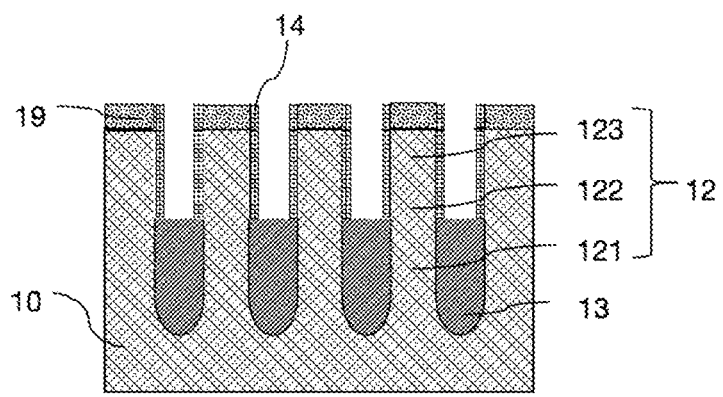

In step S30', before the protective dielectric layer 14 is formed, a filling dielectric layer 13 is formed in the first trench 11. The filling dielectric layer 13 covers the sidewall of the first initial source-drain region 121, and exposes the sidewall of the second initial source-drain region 123, and the sidewall of the initial channel region 122, as shown in FIG. 13. For example, the filling dielectric layer 13 may be a silicon oxide layer or a silicon oxynitride layer. For the process steps of forming the filling dielectric layer 13, refer to the foregoing embodiment. Details are not described herein again.

After the filling dielectric layer 13 is formed, the protective dielectric layer 14 is formed on the obtained structure. The protective dielectric layer 14 may be, for example, a carbon layer. For example, for the process steps of forming the protective dielectric layer 14, refer to steps S31 and S32, to obtain the structure shown in FIG. 14. The protective dielectric layer 14 covers the sidewall of the second initial source-drain region, the sidewall of the initial channel region 122, and the sidewall of the cap layer 19.

Figure 15:
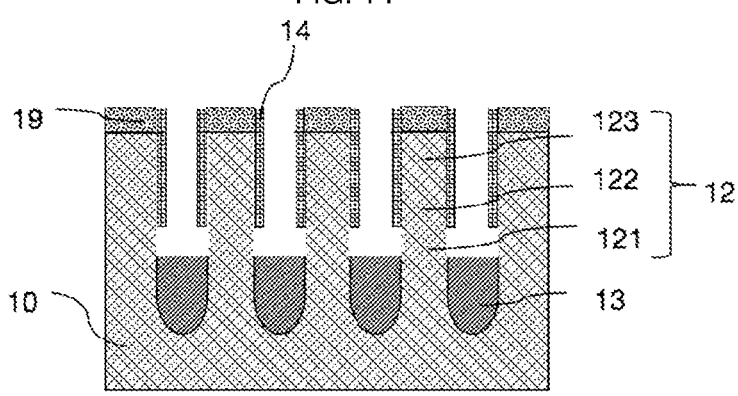

In step S40', the step of forming the bit line structure 17 specifically includes:

S41': Decrease a height of the filling dielectric layer 13, to expose the sidewall of the first initial source-drain region 121, as shown in FIG. 15.

For example, the filling dielectric layer 13 may be etched back, to partially remove the filling dielectric layer 13 and expose the sidewall of the first initial source-drain region 121.

S42': Form a metal material layer on the sidewall of the first initial source-drain region 121.

For example, before the metal material is deposited, the obtained structure may be cleaned, to remove the impurities on the sidewall of the first initial source-drain region 121, and prevent the remaining impurity particles from affecting the formation of the metal silicide.

The metal material layer is deposited at the bottom of the first trench 11. The metal material layer covers the top of the filling dielectric layer 13 and the sidewall of the first initial source-drain region 121. For example, the top surface of the metal material layer is flush with that of the protective dielectric layer 14. In some embodiments, the metal material includes at least one of cobalt and nickel. Optionally, the metal material may also include titanium, zirconium, tantalum, tungsten, palladium, or platinum.

Figure 16:
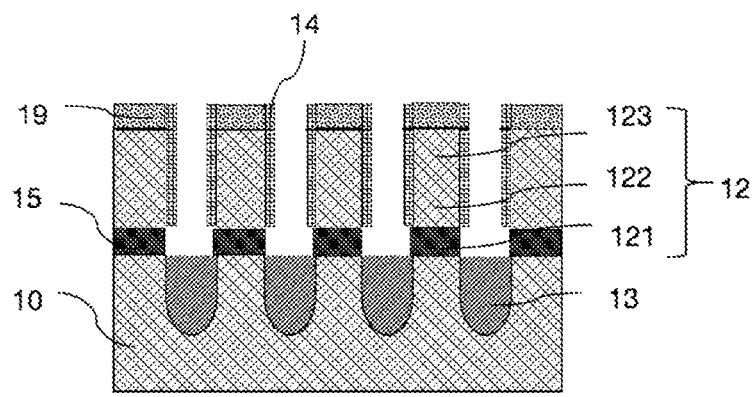

S43': Perform an annealing process, to form a metal silicide layer 15 in the first initial source-drain region 121, as shown in FIG. 16.

After the metal material layer is formed, the obtained structure is annealed. For example, the RTP process may be used to make the metal material chemically react with silicon to form the metal silicide layer 15 in the first initial source-drain regions 121 and form the metal silicide bit line. In this case, adjacent bit lines are electrically connected by using the metal material. Therefore, it is also necessary to use an etching process to etch and remove the residual metal material layer in the first trench 11, thereby forming bit line structures 17 independent of each other, as shown in FIG. 16.

Optionally, in some embodiments, after the metal material layer is removed, a second annealing process may be performed on the metal silicide bit line, to enhance the degree of reaction between the metal material and the silicon, and ensure that the metal silicide diffuses through the first initial source-drain region 121, thereby forming a high-quality metal silicide bit line.

Figure 17:
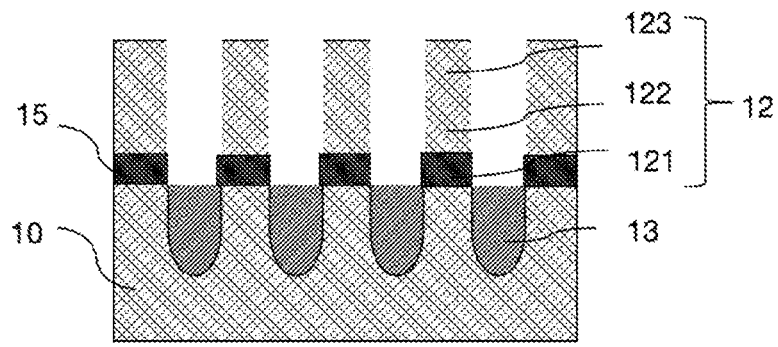
Figure 18:
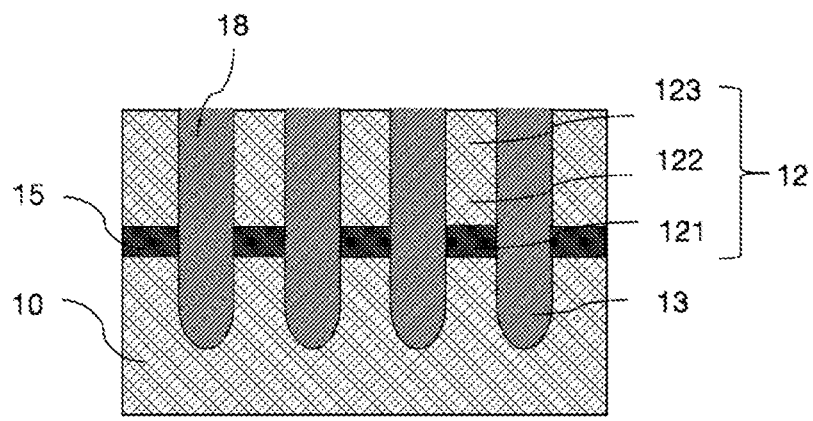

As shown in FIGS. 17 and 18, the protective dielectric layer 14 and the cap layer 19 are removed, and an isolation dielectric layer 18 is formed in the first trench 11. For example, the isolation dielectric layer 18 and the filling dielectric layer 13 may be made of a same material, such as a silicon oxide layer or a silicon oxynitride layer. The isolation dielectric layer 18 is formed in the first trench 11, to separate the bit line structures 17 along the first direction.

For example, after the metal silicide bit line and the isolation dielectric layer 18 are formed, with reference to steps S60 to S80 in the foregoing embodiments, the word line structure and the pillar active region are formed in the base 10.

In the foregoing method of manufacturing a semiconductor structure, the metal material layer is deposited in the first trench 11 and covers two sides of the first initial source-drain region 121. It can be ensured that a continuous metal silicide bit line is formed along the first direction through the annealing process. In addition, in some embodiments, after twice annealing processes, the quality of the formed metal silicide bit line can be improved. Compared with the traditional process that the metal silicide layer 15 is formed at the bottom of the word line trench, the foregoing method in which the metal silicide layer 15 and the bit line are made by using the same manufacturing method is different. In this embodiment, the metal material is deposited in the bit line trench (that is, the first trench 11), which can ensure that the metal material covers all positions along an extension direction of the bit line. A continuous metal silicide layer 15 is definitely formed after the annealing process. In addition, when formed, the metal silicide layer 15 starts to diffuse from both sides of the first initial source-drain region 121. From a single side, it is only necessary to ensure that the diffusion width reaches half of that of the first initial source-drain region 121, to reduce the technical difficulty of manufacturing the metal silicide bit line and improve the product yield.

An embodiment of the present application further discloses a semiconductor structure, including a base 10, where the base 10 includes a pillar active region, and the pillar active region includes a first source-drain region, a second source-drain region away from the first source-drain region, and a channel region located between the first source-drain region and the second source-drain region; and a width of the first source-drain region is smaller than a width of the channel region, and the first source-drain region includes a metal silicide layer 15; a plurality of bit line structures 17 extending along a first direction, located outside the first source-drain region, and electrically connected to the first source-drain region; and a plurality of word line structures extending along a second direction and located outside the channel region.

For example, the base 10 includes, but is not limited to a silicon base. The width of the first source-drain region is smaller than the width of the channel region. For example, the width of the first source-drain region is ½ to ⅔ of that of the channel region. The bit line structure 17 is located outside the first source-drain region. For example, a sum of widths of the bit line structure 17 and the first source-drain region is equal to that of the channel region. Optionally, in some embodiments, the sum of widths of the bit line structure 17 and the first source-drain region is slightly greater than that of the channel region. Optionally, an isolation dielectric layer 18 is disposed between adjacent bit line structures 17 and between adjacent word line structures. The isolation dielectric layer 18 may be, for example, a silicon oxide layer or silicon oxynitride layer. The isolation dielectric layer 18 further fills a space between adjacent pillar active regions, to separate them.

In the foregoing semiconductor structure, the width of the first source-drain region is smaller than the width of the channel region, and the bit line structures 17 are located at two sides of the first source-drain region, to increase the contact area between the bit line structure 17 and the first source-drain region, and decrease the contact resistance. In addition, the first source-drain region includes the metal silicide layer 15, to further reduce the contact resistance between the first source-drain region and the bit line structure 17, and decrease the RC delay.

In an embodiment, the bit line structure 17 includes a metal barrier layer and a metal conductive layer, and the word line structure includes a gate oxide layer located outside the channel region and a gate conductive layer located outside the gate oxide layer.

For example, the metal barrier layer is located between the metal conductive layer and the first source-drain region, to separate them. The metal barrier layer may include, but is not limited to a titanium layer or a titanium nitride layer. The metal conductive layer may include, but is not limited to Ge, W, Cu, or Au. For example, the gate oxide layer includes a silicon oxide layer. The gate conductive layer includes a metal layer or a polysilicon layer.

In some embodiments, the semiconductor structure further includes: a protective dielectric layer 14 covering a sidewall of the second source-drain region. For example, the protective dielectric layer 14 may include, but is not limited to a carbon layer.

In some embodiments, a top of the second source-drain region includes a metal silicide layer 15. The metal silicide layer 15 is further formed in the second source-drain region, to reduce the contact resistance between the second source-drain region and another conductive structure, and reduce the energy consumption.

In some embodiment, the pillar active region is an N-type doped region, and the base 10 is a P-type doped base. Different types of doping are performed on the base 10 and the active region, to avoid current leakage of the bit line structure 17.

An embodiment of the present application further discloses a semiconductor structure, including a base 10, where the base 10 includes a pillar active region, and the pillar active region includes a first source-drain region, a second source-drain region away from the first source-drain region, and a channel region located between the first source-drain region and the second source-drain region; a metal silicide bit line extending along the first direction and electrically connected to the first source-drain region; and a plurality of word line structures extending along a second direction and located outside the channel region.

The metal silicide bit line includes a first part and a second part arranged alternately. The first part is electrically connected to the first source-drain region, and the second part is located between two adjacent first parts. The metal silicide bit line connects in series the pillar active regions arranged on a straight line along the first direction.

The technical characteristics of the above embodiments can be employed in arbitrary combinations. To provide a concise description of these embodiments, all possible combinations of all the technical characteristics of the above embodiments may not be described; however, these combinations of the technical characteristics should be construed as falling within the scope defined by the specification as long as no contradiction occurs.

The above embodiments are only intended to illustrate some implementations of the present disclosure in detail, and should not be construed as a limitation to the patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A method of manufacturing a semiconductor structure, comprising:
   providing a base;
   forming, in the base, a plurality of first trenches arranged in parallel at intervals and extending along a first direction, and an initial active region between two adjacent ones of the plurality of first trenches, wherein the initial active region comprises a first initial source-drain region close to a bottom of a first trench of the plurality of first trenches, a second initial source-drain region away from the bottom of the first trench of the plurality of first trenches, and an initial channel region located between the first initial source-drain region and the second initial source-drain region;
   forming a filling dielectric layer in the first trench of the plurality of first trenches, wherein the filling dielectric layer covers a sidewall of the first initial source-drain region, and exposes a sidewall of the second initial source-drain region and a sidewall of the initial channel region;
   forming a protective dielectric layer, wherein the protective dielectric layer covers the sidewall of the second initial source-drain region and the sidewall of the initial channel region;
   thinning the first initial source-drain region; and
   depositing a conductive material layer at two opposite sides of the first initial source-drain region, to form bit line structures, wherein the bit line structures extend along the first direction, wherein
   the forming a protective dielectric layer comprises:
      depositing a protective dielectric material layer, wherein the protective dielectric material layer covers an upper surface of the filling dielectric layer, the sidewall of the initial channel region, and the sidewall and a top surface of the second initial source-drain region; and removing the protective dielectric material layer on the upper surface of the filling dielectric layer and on the top surface of the second initial source-drain region, and forming the protective dielectric layer; and the thinning the first initial source-drain region comprises:

partially removing the filling dielectric layer, to expose the sidewall of the first initial source-drain region;

oxidizing the first initial source-drain region, to form a sidewall oxide layer on the sidewall of the first initial source-drain region; and removing the sidewall oxide layer.

2. The method of manufacturing the semiconductor structure according to claim 1, after the thinning the first initial source-drain region and before the depositing a conductive material layer, further comprising:

depositing a metal material on exposed surfaces of the first initial source-drain region and the second initial source-drain region; and performing an annealing process, to form a metal silicide layer in the first initial source-drain region and in the second initial source-drain region.

3. The method of manufacturing the semiconductor structure according to claim 2, wherein the metal material comprises at least one of cobalt or nickel.

4. The method of manufacturing the semiconductor structure according to claim 1, after the forming a plurality of first trenches arranged in parallel at intervals and extending along a first direction, and an initial active region between two adjacent ones of the plurality of first trenches, further comprising:

forming a covering layer at a top of the initial active region, to protect the top of the initial active region in a subsequent manufacturing process.

5. The method of manufacturing the semiconductor structure according to claim 1, wherein the depositing a conductive material layer at two opposite sides of the first initial source-drain region, to form bit line structures comprises:

depositing and etching back the conductive material layer on the upper surface of the filling dielectric layer, to make a top surface of the conductive material layer flush with a bottom surface of the protective dielectric layer; and etching the conductive material layer based on the protective dielectric layer, to cut off the conductive material layer, and expose a partial upper surface of the filling dielectric layer, and forming the bit line structures.

6. The method of manufacturing the semiconductor structure according to claim 5, after the forming the bit line structures, further comprising:

forming an isolation dielectric layer, wherein the isolation dielectric layer fills up the plurality of first trenches, and a top surface of the isolation dielectric layer is flush with the top surface of the second initial source-drain region.

7. The method of manufacturing the semiconductor structure according to claim 6, after the forming an isolation dielectric layer, further comprising:

etching the initial active region, to form second trenches arranged in parallel at intervals along a second direction, and a pillar active region separated by the plurality of first trenches and the second trenches, wherein the pillar active region comprises a first source-drain region close to a bottom of a second trench of the second trenches, a second source-drain region away from the bottom of the second trench of the second trenches, and a channel region located between the first source-drain region and the second source-drain region, and a bottom surface of the second trench of the second trenches is at least lower than a bottom surface of the channel region;

forming a gate oxide layer and a gate material layer sequentially in the second trenches, to cover a side surface of the channel region; and etching the gate material layer, to form a word line structure, wherein the word line structure extends along the second direction, and the first direction is perpendicular to the second direction.

* * * * *